United States Patent
Murakuki

(10) Patent No.: US 6,999,335 B2
(45) Date of Patent: Feb. 14, 2006

(54) SEMICONDUCTOR MEMORY DEVICE WITH IMPROVED MEMORY RETENTION

(75) Inventor: Yauso Murakuki, Kyotanabe (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 0 days.

(21) Appl. No.: 10/862,327

(22) Filed: Jun. 8, 2004

(65) Prior Publication Data

US 2004/0246763 A1 Dec. 9, 2004

(30) Foreign Application Priority Data

Jun. 9, 2003 (JP) .............................. 2003-163060

(51) Int. Cl.
*G11C 11/22* (2006.01)
(52) U.S. Cl. ...................... 365/145; 365/149; 365/210
(58) Field of Classification Search ................ 365/145, 365/149, 210
See application file for complete search history.

(56) References Cited

U.S. PATENT DOCUMENTS

| 5,572,459 A | 11/1996 | Wilson et al. .............. 365/145 |
| 5,953,277 A * | 9/1999 | Mukunoki et al. .......... 365/210 |
| 5,969,979 A * | 10/1999 | Hirano ....................... 365/145 |
| 5,978,250 A | 11/1999 | Chung et al. ............... 365/145 |
| 6,839,289 B2 * | 1/2005 | Takahashi .............. 365/189.07 |

FOREIGN PATENT DOCUMENTS

JP 8-115596 5/1996

* cited by examiner

*Primary Examiner*—Son Mai
(74) *Attorney, Agent, or Firm*—Steptoe & Johnson LLP

(57) ABSTRACT

A semiconductor memory device permitting the data "0" and the data "1" to be arbitrarily written to a reference cell capacitor for generating a reference potential, having a non-volatile capacitor for storing the data to be written. Fine adjustment of the reference potential is possible without a mask correction, which improves yield. The present invention also permits rewriting only the reference capacitors. As such, the dispersion of the reference potential can be controlled, and yield is improved.

8 Claims, 12 Drawing Sheets

SEMICONDUCTOR MEMORY DEVICE WITH IMPROVED MEMORY RETENTION

BACKGROUND OF THE INVENTION

1. Field of the Invention

The present invention relates to a non-volatile memory device, and more particularly to a reference potential generation technology in the read operation of a 1T1C type ferroelectric memory FeRAM (Ferroelectric Random Access Memory).

2. Description of the Related Art

FIG. 11 shows the configuration of a conventional 1T1C (one transistor one capacitor) type ferroelectric memory. This shows a memory cell array with a 1 row, 2 n column, 1 I/O configuration, where n can be an arbitrary integer.

1001 to 1008 are 1T1C type ferroelectric memory cells. 1011 to 1014 are sense amplifiers for amplifying the potential difference of the bit lines BLt [2n+1:0] and BLb [2n+1:0] which are in a complementary relationship. Cb is a parasitic capacitance of the bit line. 1021 to 1024 are reference cells for generating reference potential. 1031 is a reference potential regulator for adjusting the reference potential.

BLt [2n+1:0] indicates all of BLt [0], BLt [1] to BLt [2n+1], and BLb [2n+1:0] indicates all of BLb [0], BLb [1] to BLb [2n+1]. Of these, the bit lines BLt [0] and BLb [0], bit lines BLt [1] and BLb [1], bit lines BLt [2n+1] and BLb [2n+1] are in a complementary relationship respectively.

WL is a select signal for selectively connecting the first terminal of the ferroelectric capacitor in the 1T1C type ferroelectric memory cell to the bit line.

CP is a cell plate line for applying the power supply voltage or the ground potential to the second terminals of the ferroelectric capacitors in the 1T1C type ferroelectric memory cells.

REFWL is a select signal for connecting the first terminal of the ferroelectric capacitor of the reference cell to the bit line.

REFCP is a reference cell plate line for applying the power supply voltage or the ground potential to the second terminals of the ferroelectric capacitors of the reference cells.

REFEQ is a control signal for conducting the equalization transistor for equalizing the potential of the bit lines.

EQN is a node for connecting bit lines.

REFST is a select signal for applying a predetermined voltage on the ferroelectric capacitors of the reference cells.

REFSET is a reference cell write line for applying the power supply voltage or the ground potential to the ferroelectric capacitors of the reference cells.

FE_tb [m:0] is a ferroelectric capacitor for storing electric charges for adjusting the reference potential.

EQLEVEL is a potential for storing the electric charges in FE_tb [m:0] for adjusting the reference potential.

EQSET is a control signal for storing the electric charges in FE_tb [m:0].

EQADJUST is a control signal for releasing the electric charges stored in FE_tb [m:0] and adjusting the reference potential by connecting EQNA and EQN.

FIG. 12 shows a timing chart of this prior art.

At the timing t1, WL and REFWL become VPP level (power supply voltage VDD+"NMOS Vt"), and the first terminals of the ferroelectric capacitors of the ferroelectric memory cells are connected to BLt [2n+1:0] respectively, and the first terminals of the ferroelectric capacitors of the reference cells are also connected to the BLb [2n+1:0] respectively.

At the timing t2, CP and REFCP become VDD level (power supply voltage level), and at timing t3, CP and REFCP become ground level, so that the ferroelectric memory cells are read to the BLt [2n+1:0] (for details on the read principle, see Japanese Patent Application Laid-Open No. H8-115596), and data written to the reference cells is read to the BLb [2n+1:0].

At the timing t4, all the BLb [2n+1:0] of the BLb [2n+1:0] are equalized. In the ferroelectric capacitors FE_b [n:0] of the reference cells, the data "1" has been written in advance, and in FE_t [n:0], the data "0" has been written in advance. By this equalization, the potential of BLb [2n+1:0] becomes the reference potential. If the potential of the data "1", which is read to the BLt [2n+1:0], is vH and the potential of the data "0" is vL, the reference potential Vref_e at this equalization becomes $$Vref\_e=(vH+vL)/2.$$

At the timing t4a, EQN and EQNA are connected. In this case, FEFL and EQLEVEL are at ground level, so electric charges are redistributed according to the capacity of FE_tb [m:0] connected to EQNA, and the potential of EQN drops. This operation is the adjustment operation of the reference potential Vref.

At the timing t5, EQADJUST becomes ground level, and the adjustment operation of the reference potential ends.

At the timing t6, the sense amplifiers are activated, and the amplification operation of BLt [2n+1:0] and the reference potential BLb [2n+1:0] is performed.

At the timing t7, the ferroelectric capacitors of the reference cells are disconnected from BLb [2n+1:0].

At the timing t8, the precharge of the reference potential adjustment node EQNA starts and REFST becomes VPP level, and at the timing t9, the writing of the data "0" to FE_t [n:0] of the reference cell starts.

At the timing t10, CP becomes VDD level, and the data "0" of the 1T1C type ferroelectric memory cells is written, and at the timing t11, the rewriting of the data "0" ends.

At the timing t12, WL becomes ground level, and the ferroelectric capacitors of the 1T1C memory cells are disconnected from BLt [2n+1:0].

At the timing t13, REFSET becomes ground level, the writing of the data "0" to the ferroelectric capacitors FE_t [n:0] of the reference cells ends, REFST becomes ground level, the first terminals of the reference cells FE_t [n:0] are disconnected from REFSET, and the first terminals of FE_b [n:0] are disconnected from ground.

At the timing t15, the bit lines BLt [2n+1:0] and BLb [2n+1:0] are discharged to the ground level, and the read operation completes (e.g. Japanese Patent Application Laid-Open No. H8-115596, see page 12, FIG. 16).

However, in a conventional method, the reference potential Vref is the intermediate potential of the data "1" and the data "0", which is output to the bit lines read from the 1T1C type ferroelectric memory cells. And for the adjustment, either adding or subtracting a predetermined voltage ΔVref alone is possible. In other words, according to a conventional method, the reference potential is $$VrefH=Vref+\Delta Vref$$

$$VrefM=Vref$$

$$VrefL=Vref-\Delta Vref,$$

that is, there is a limit of three values at the intermediate potential of the data "1" and the data "0" which are output to the bit lines read from the Vref:1T1C type ferroelectric memory cells. With this, fine adjustment of the reference potential, which is most important in 1T1C operation, cannot be performed, and improving yield is difficult. Also the dispersion of reference potential after retention is large, so the ferroelectric memory has a retention problem.

SUMMARY OF THE INVENTION

A semiconductor memory device of the present invention comprises a first, second, third and fourth bit lines to be connected to a first, second, third and fourth ferroelectric memory cells respectively, a fifth, sixth, seventh and eighth bit lines to be connected to sense amplifier circuits to be a pair with the first, second, third and fourth bit lines respectively, a first, second, third and fourth reference cell capacitors to be connected to the fifth, sixth, seventh and eighth bit lines respectively when a reference word line is activated, a first, second, third and fourth reference cell write control lines to be connected to the first, second, third and fourth reference cell capacitors when a reference cell write control line select signal is activated, equalization circuits for equalizing the potential of the fifth, sixth, seventh and eighth bit lines when an equalization control signal is activated, and a potential setting circuit for selectively setting an equalization circuit for equalizing the potential of the fifth, sixth, seventh and eighth bit lines when the equalization control signal is activated, and at least one potential of the first, second, third and fourth reference cell write control lines to a first potential or a second potential independently from at least one of the other reference cell write control lines, and by this configuration, desired data can be written to the plurality of reference cell capacitors. And by changing the ratio of the data "0" and the data "1" to be written to the reference cell capacitors, fine adjustment of the reference potential becomes possible, and yield can be improved.

Preferably, the semiconductor memory device is also characterized in that the potential setting of the first, second, third and fourth reference cell write control lines by the potential setting circuit is executed using the stored data in the non-volatile storage means.

The semiconductor memory device is also characterized in that the first, second, third and fourth reference cell capacitors are ferroelectric capacitors.

The semiconductor memory device is also characterized in that the potential setting of the first, second, third and fourth reference cell write control lines by the potential setting circuit is changed depending on the stored data of the non-volatile storage means for each read cycle, so the write data to the reference cells can be changed for each read cycle, and if the write data to the reference cells is changed for each read, imprint can be controlled. The semiconductor memory device has a circuit for detecting the operation environment (e.g. temperature detection), so the reference potential can be adjusted according to the operation environment, and yield can be improved by setting the reference potential to an optimum value.

The semiconductor memory device is also characterized in that a first terminal of the first reference cell capacitor, a first terminal of the second reference cell capacitor, a first terminal of the third reference cell capacitor, and a first terminal of the fourth reference cell capacitor are connected to the fifth, sixth, seventh and eighth bit lines respectively by activation of the reference word line, and the first terminal of the first reference cell capacitor, the first terminal of the second reference cell capacitor, the first terminal of the third reference cell capacitor and the first terminal of the fourth reference cell capacitor are connected to the first, second, third and fourth reference cell write control lines respectively by activation of the write control signal.

The semiconductor memory device is also characterized in that the first, second, third and fourth reference cell capacitors are ferroelectric capacitors.

The semiconductor memory device is also characterized in that the first terminal of the first reference cell capacitor, the first terminal of the second reference cell capacitor, the first terminal of the third reference cell capacitor and the first terminal of the fourth reference cell capacitor are connected to the first, second, third and fourth reference cell write lines respectively, and a second terminal of the first reference cell capacitor, a second terminal of the second reference cell capacitor, a second terminal of the third reference cell capacitor and a second terminal of the fourth reference cell capacitor are controlled so that the data can be written to the first, second, third and fourth reference cell capacitors, when a memory cell array, including the first, second, third, and fourth ferroelectric memory cells, is not selected, so according to this configuration, retention may become a problem due to the dispersion of the reference potential, but since the write operation of the reference cells can be executed independently, the dispersion of the reference potential can be decreased by writing the reference cells just before reading the memory cells, and the read operation margin increases, and the retention problem can be improved. The write operation of the reference cells can be arbitrarily executed.

The semiconductor memory device is also characterized in that a power supply detection circuit is included, and the reference cell rewrite operation for rewriting data to the first, second, third and fourth reference cell capacitors after power is applied is automatically executed, so according to this configuration, where the reference cells are automatically written when power is applied, the retention problem can be improved without the user executing the reference cell write operation.

DESCRIPTION OF THE PREFERRED EMBODIMENTS

Embodiments of the present invention will now be described with reference to FIG. 1 to FIG. 10.

Figure 1:
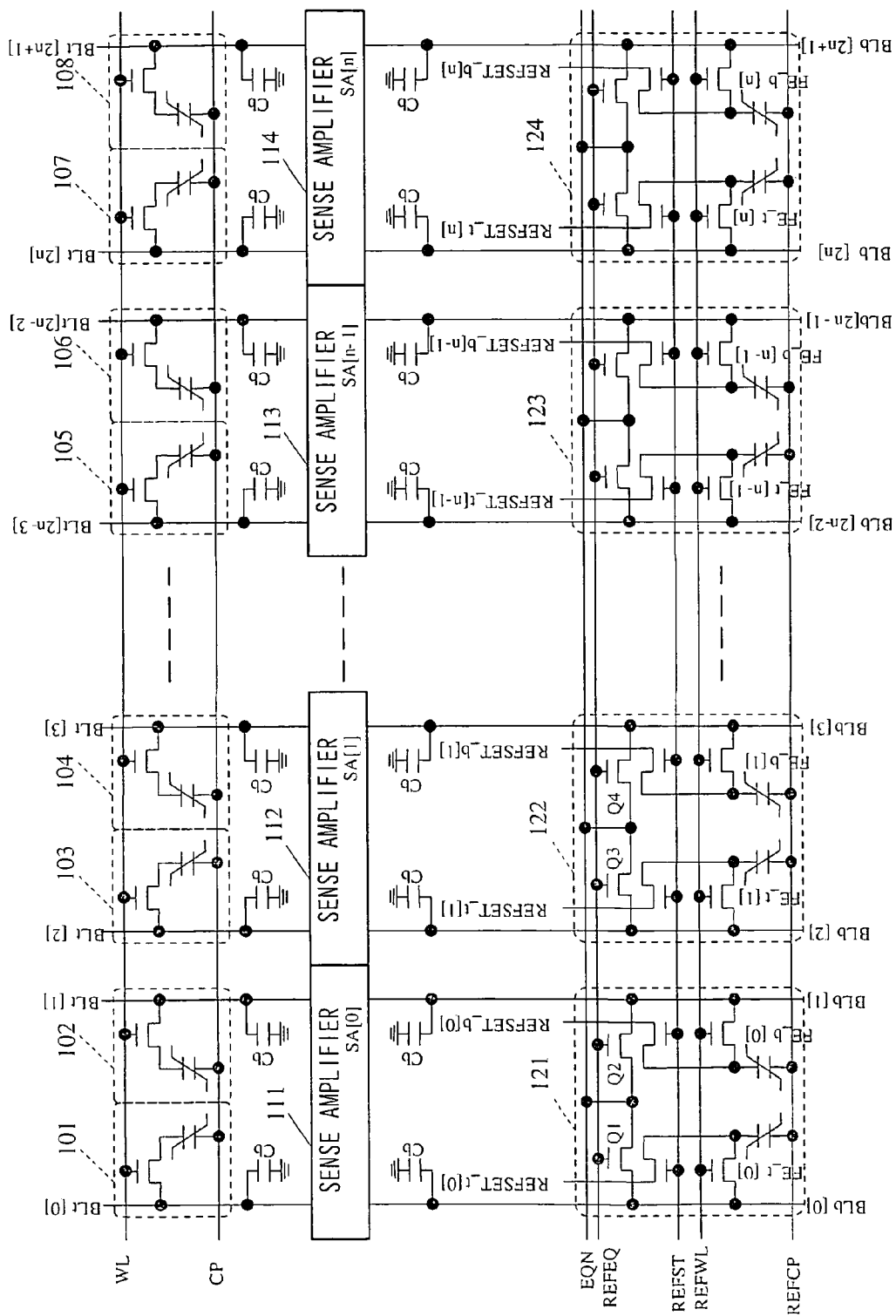
FIG. 1 is a diagram depicting a configuration of a semiconductor memory device according to an embodiment of the present invention.

FIG. 1 shows a configuration of a 1T1C type ferroelectric memory device according to an embodiment of the present invention.

101 to 108 are 1T1C type ferroelectric memory cells.

111 to 114 are sense amplifiers for amplifying the potential difference between the bit lines BLt [2n+1:0] and BLb [2n+1:0].

121 to 124 are reference cells for outputting the reference potential to the bit line BLb [2n+1:0]. FE_t [n:0] and FE_b [n:0] are ferroelectric capacitors. Cb are the parasitic capacitors of the bit lines BLt [2n+1:0] and BLb [2n+1:0].

WL is a word line to which a select signal for connecting the first terminals of the ferroelectric capacitors of the 1T1C type memory cells 101 to 108 to the bit line BLt [2n+1:0] is applied.

CP is a cell plate line for driving the second terminals of the ferroelectric capacitors 101 to 108 of the 1T1C type memory cells 101 to 108 to VDD or ground level.

REFWL is a reference word line to which a select signal for connecting the first terminals of the ferroelectric capacitors FE_t [n:0] and FE_b [n:0] of the reference cells 121 to 124 to the bit line BLb [2n+1:0] is applied.

REFCP is a cell plate line for driving the second terminals of the ferroelectric capacitors FE_t [n:0] and FE_b [n:0] of the reference cells 121 to 124 to VDD or ground level.

REFST is a select signal for connecting the first terminals of the ferroelectric capacitors FE_t [n:0] and FE_b [n:0] of the reference cells 121 to 124 to the reference cell write control lines REFSET_t [n:0] and REFSET_b [n:0] respectively.

EQN is an equalization line for equalizing BLb [2n+1:0], and this equalization line ENQ and the transistors Q1 to Q4 connected thereto constitute the equalization circuit for equalizing the potential of the fifth, sixth, seventh and eighth bit BLb [0], BLb [1], BLb [2] and BLb [3] when the equalization control signal REFEQ is activated.

Figure 2:
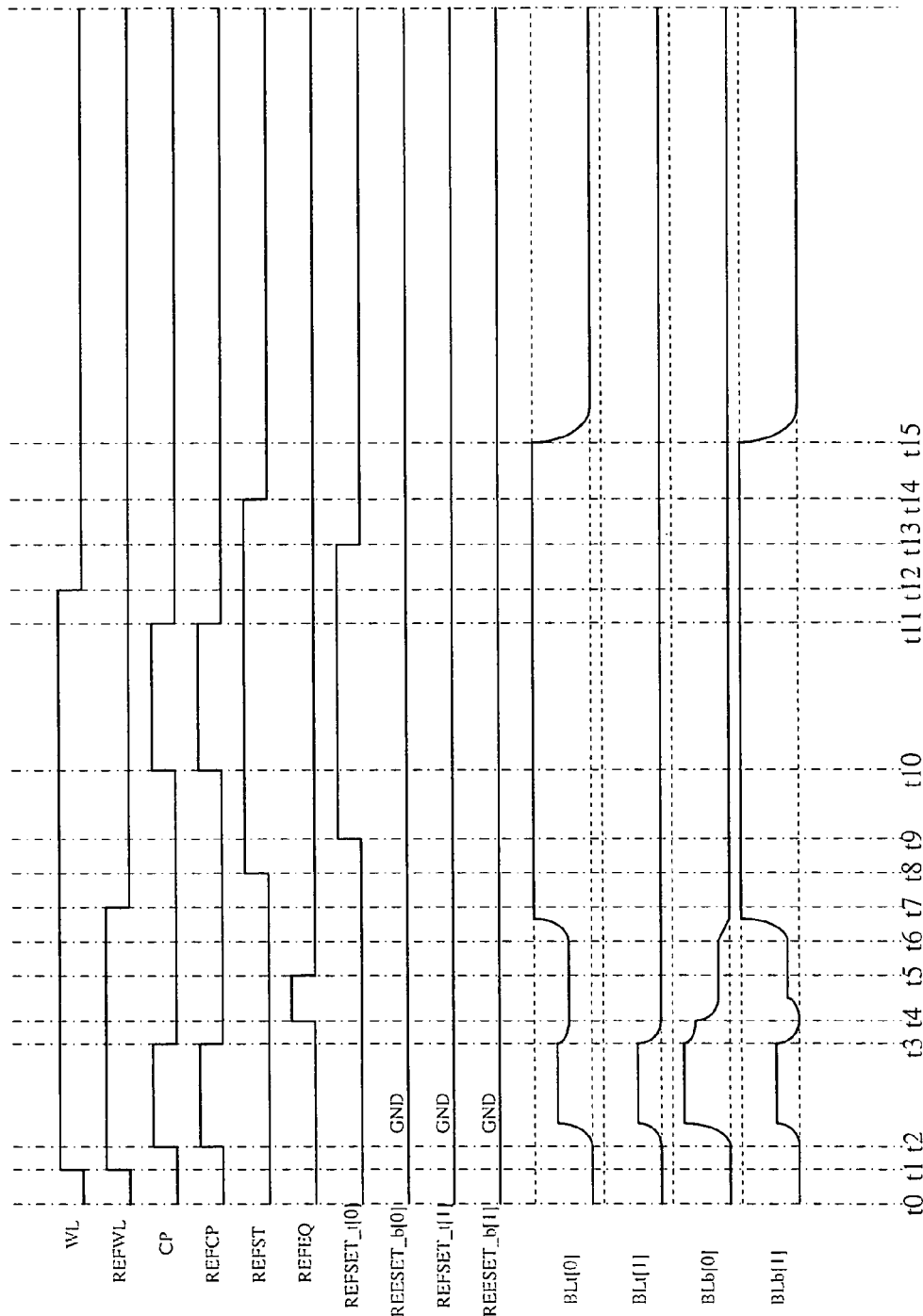
FIG. 2 is a timing chart of an embodiment of the present invention.

The read operation will now be described with reference to the timing chart in FIG. 2.

At the timing t1, WL and REFWL become VPP level (power supply voltage VDD+"NMOS Vt" or more), the first terminals of the ferroelectric capacitors of the ferroelectric memory cells are connected to BLt [2n+1:0] respectively, and the first terminals of the ferroelectric capacitors of the reference cells are also connected to BLb [2n+1:0] respectively.

At the timing t2, CP and REFCP become VDD level (power supply voltage level), and at the timing t3, CP and REFCP become ground level, so that the ferroelectric memory cells are read to the BLt [2n+1:0] (for details on the read principle, see Japanese Patent Application Laid-Open No. H8-115596), and the data written in the reference cells is read to BLb [2n+1:0].

At the timing t4, all the BLbs [2n+1:0] are equalized. By this equalization, all of the BLb [2n+1:0] become the potential of the reference potential Vref of BLb [2n+1:0].

The data written in the ferroelectric capacitors FE_t [n:0] and FE_b [n:0] of the reference cells can be independently controlled for each REFSET_t [n:0] and REFSET_b [n:0], and if the number of ferroelectric capacitors of the reference cells where the data "1" is written is nH, and the number of ferroelectric capacitors of the reference cells where the data "0" is written is nL, and the potential of the data "1" read to BLt [2n+1:0] is vH and the potential of the data "0" is vL, then the reference potential Vref can be given by $$Vref = vL + (vH - vL) \times nH/(nH + nL),$$

where nH: the number of ferroelectric capacitors of the reference cells where the data "1" is written, nL: the number of ferroelectric capacitors of the reference cells where the data "0" is written, and fine adjustment of the reference potential becomes possible.

At the timing t6, the sense amplifiers are activated, and the amplification operation of BLt [2n+1:0] and reference potential BLb [2n+1:0] is performed.

At the timing t7, the ferroelectric capacitors of the reference cells are disconnected from BLb [2n+1:0].

At the timing t8, REFST becomes VPP level, and at the timing t9, the data "1" is written to FE_t [n:0] and FE_b [n:0] of the reference cells which set REFSET_t [n:0] and REFSET_b [n:0] to VDD level (a reference cell "1" write). In FIG. 2, only REFSET_t [0] is VDD level, so "1" is written to FE_t [0].

At the timing t10, CP and REFCP become VDD level, the data "0" of the 1T1C ferroelectric memory cells is rewritten, and the data "0" is written to FE_t [n:0] and FE_b [n:0] of the reference cells which set REFSET_t [n:0] and REFSET_b [n:0] to ground level (a reference cell "0" write). In this embodiment, REFSET_t [1] and REFSET_b [1:0] are at ground level, so "0" is written to FE_t [1] and FE_b [1:0].

At the timing t11, CP and REFCP become ground level, and the rewriting of the data "0" ends.

At the timing t12, WL becomes ground level, and the ferroelectric capacitors of the 1T1C memory cells are disconnected from BLt [2n+1:0].

At the timing t13, REFSET becomes ground level, the writing of the data "0" to the ferroelectric capacitors FE_t [n:0] of the reference cells ends, REFST becomes ground level, and the first terminals of the reference cells FE_t [n:0] and FE_b [n:0] are disconnected from REFSET_t [n:0] and REFSET_t [n:0] respectively.

At the timing t15, the bit lines BLt [2n+1:0] and BLb [2n+1:0] are discharged to ground level, and the read operation completes.

Figure 3:
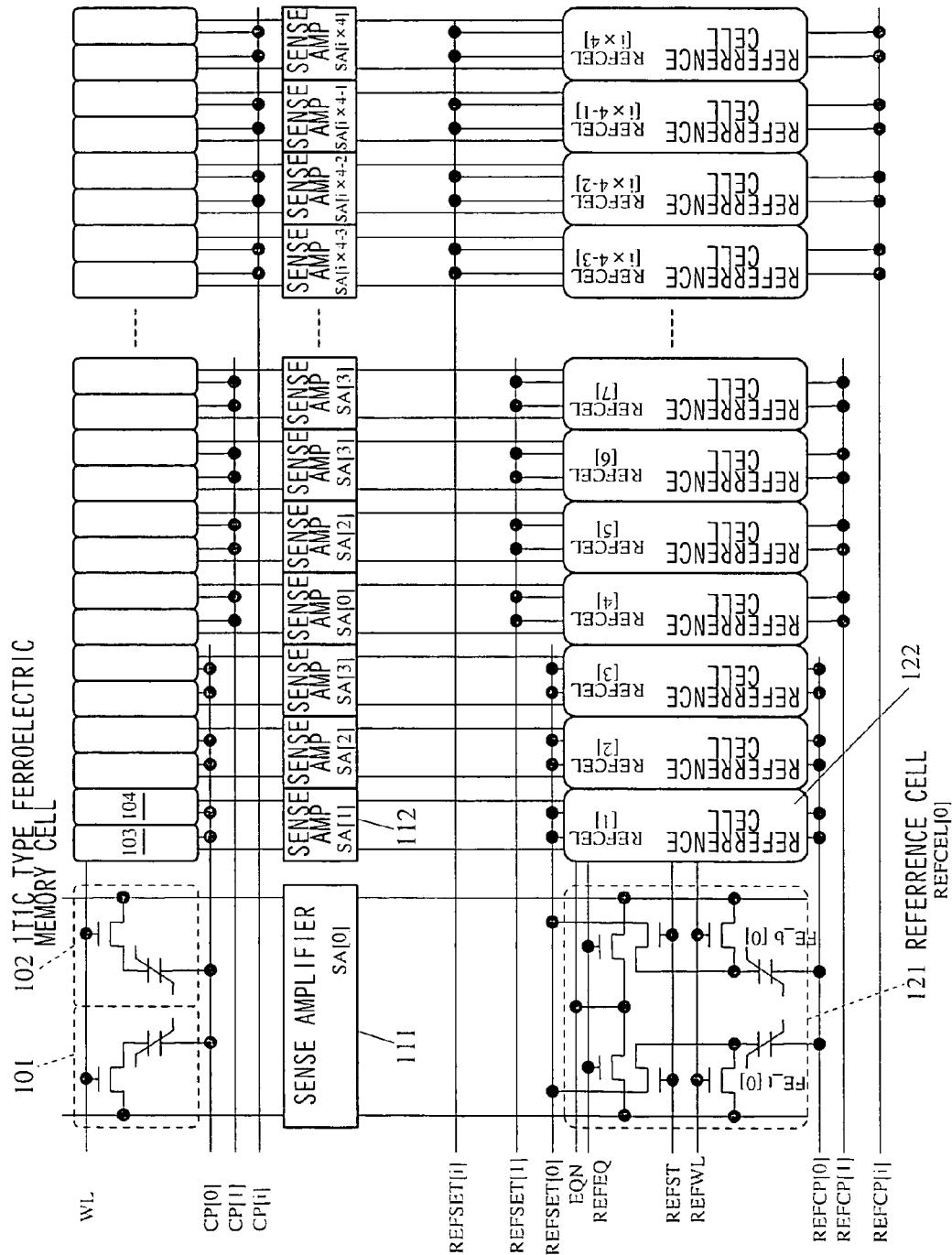
FIG. 3 is a diagram depicting a configuration of a semiconductor memory device according to an embodiment of the present invention when I/O=8.

FIG. 3 shows a memory cell array with a 1 row, i column, 8 I/O configuration to which the configuration in FIG. 1 is applied. i is an arbitrary integer.

Figure 4:
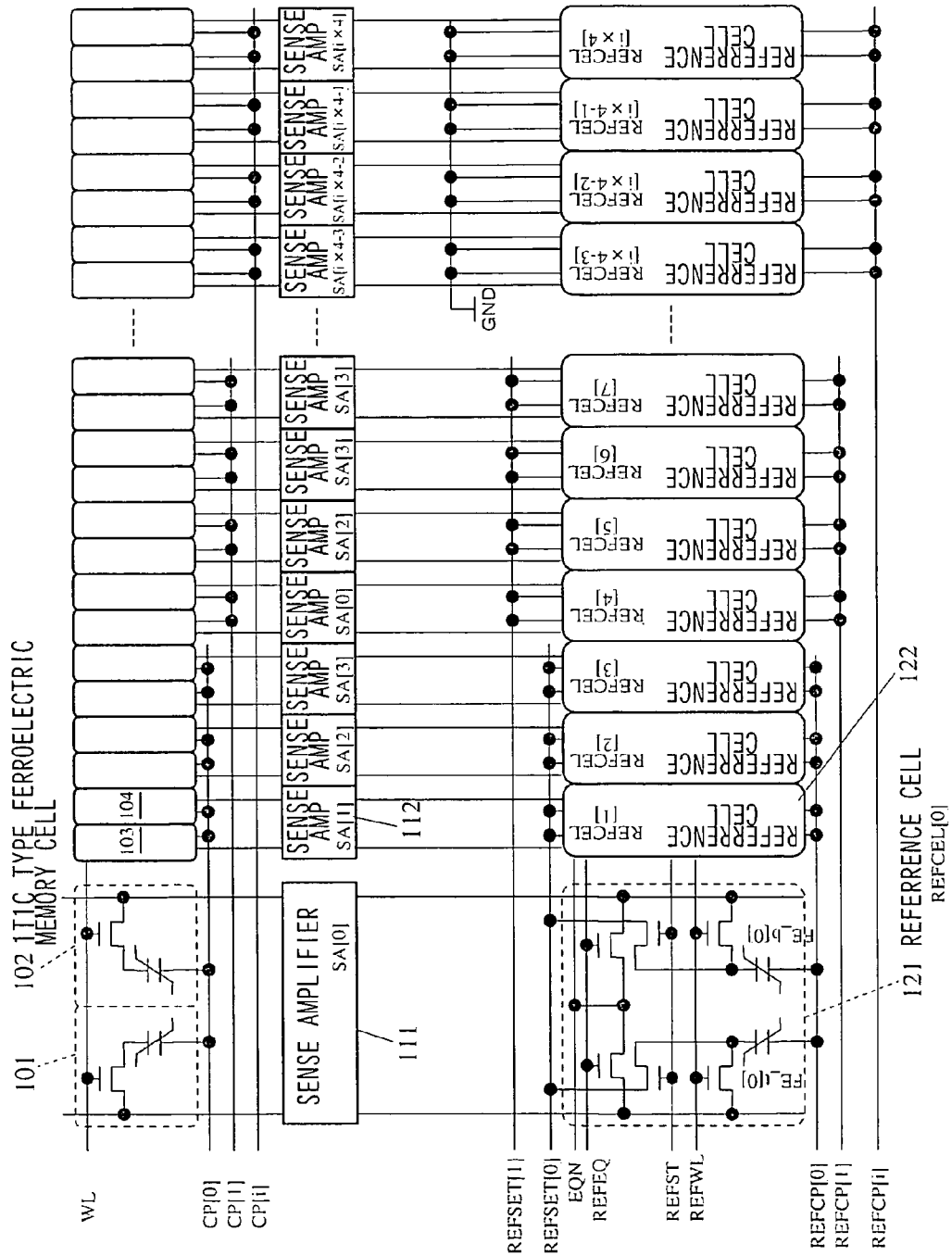
FIG. 4 is a diagram depicting a configuration of a semiconductor memory device according to an embodiment of the present invention when I/O=8 and when the write data of a reference cell is fixed.

This is an embodiment when the REFSET_t [n:0] and REFSET_b [n:0] of the reference cells shown in FIG. 1 are arranged to REFSET [0] to REFSET [i] in 8 I/O units. In other words, REFSET_t [3:0] and REFSET_b [3:0] are driven as REFSET [0], and REFSET_t [7:4] and REFSET_b [7:4] are driven as REFSET [1] sequentially. FIG. 4 is a case when I/O=8, showing the configuration when the write data of a reference cell is fixed.

By this configuration, the number of signal lines of REFSET_t [n:0] and REFSET_b [n:0] can be decreased to 1/16, and the layout area can be dramatically decreased. For REFSET [i], only the number of REFSET [i] required for fine adjustment of the reference potential can be driven, which can further decrease the area (see FIG. 4).

Figure 5:
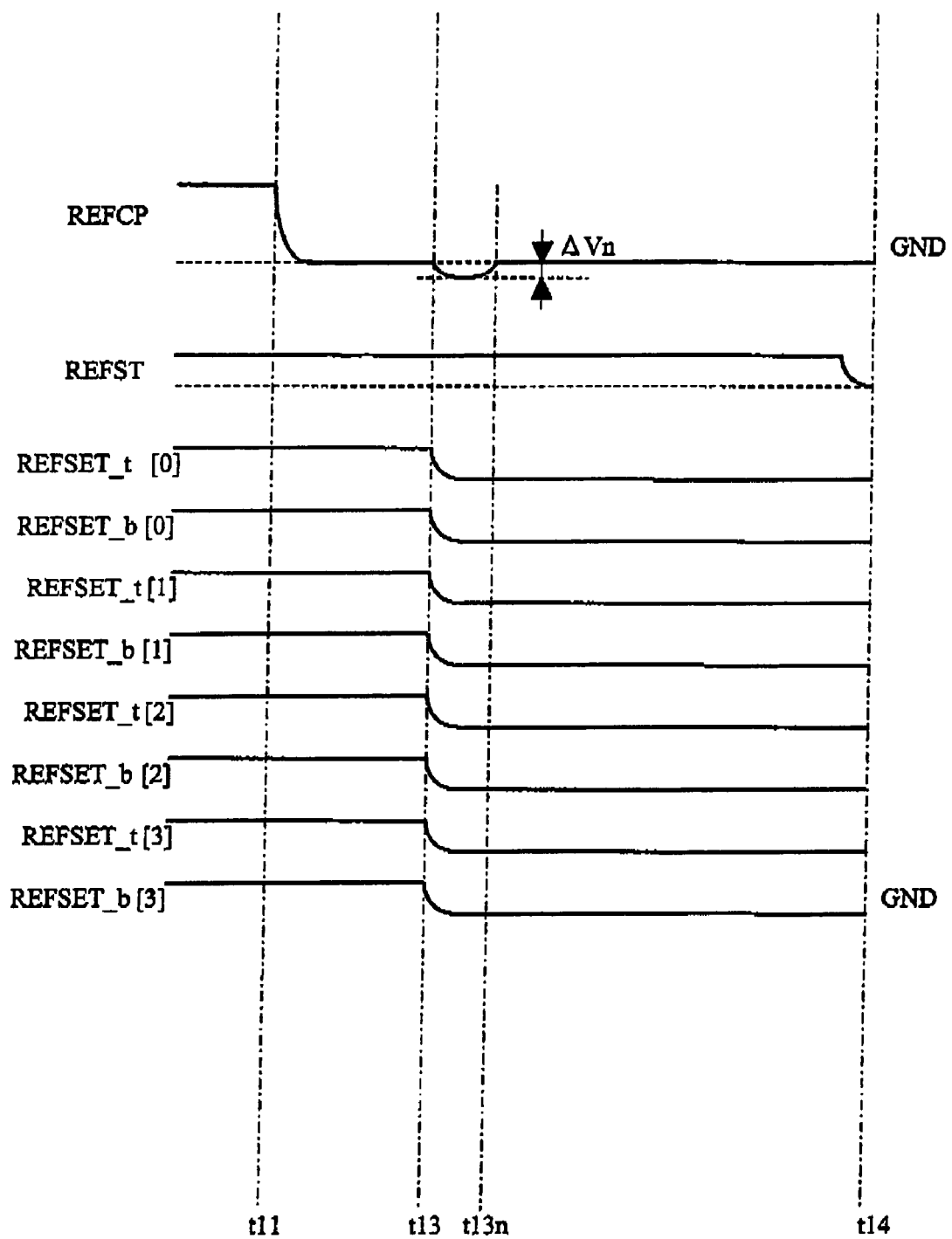
FIG. 5 is a time chart when only a same data is written to each cell plate according to an embodiment of the present invention.

Since the data to be written to the ferroelectric capacitors FE_t [n:0] and FE_b [n:0] of the reference cells to be connected to a same REFCP can be all the same data, noise can be controlled. Noise is generated at the timing t13 in FIG. 2. FIG. 5 shows the relationship of REFCP and REFSET when a same data is written at the timing t13.

Figure 6:
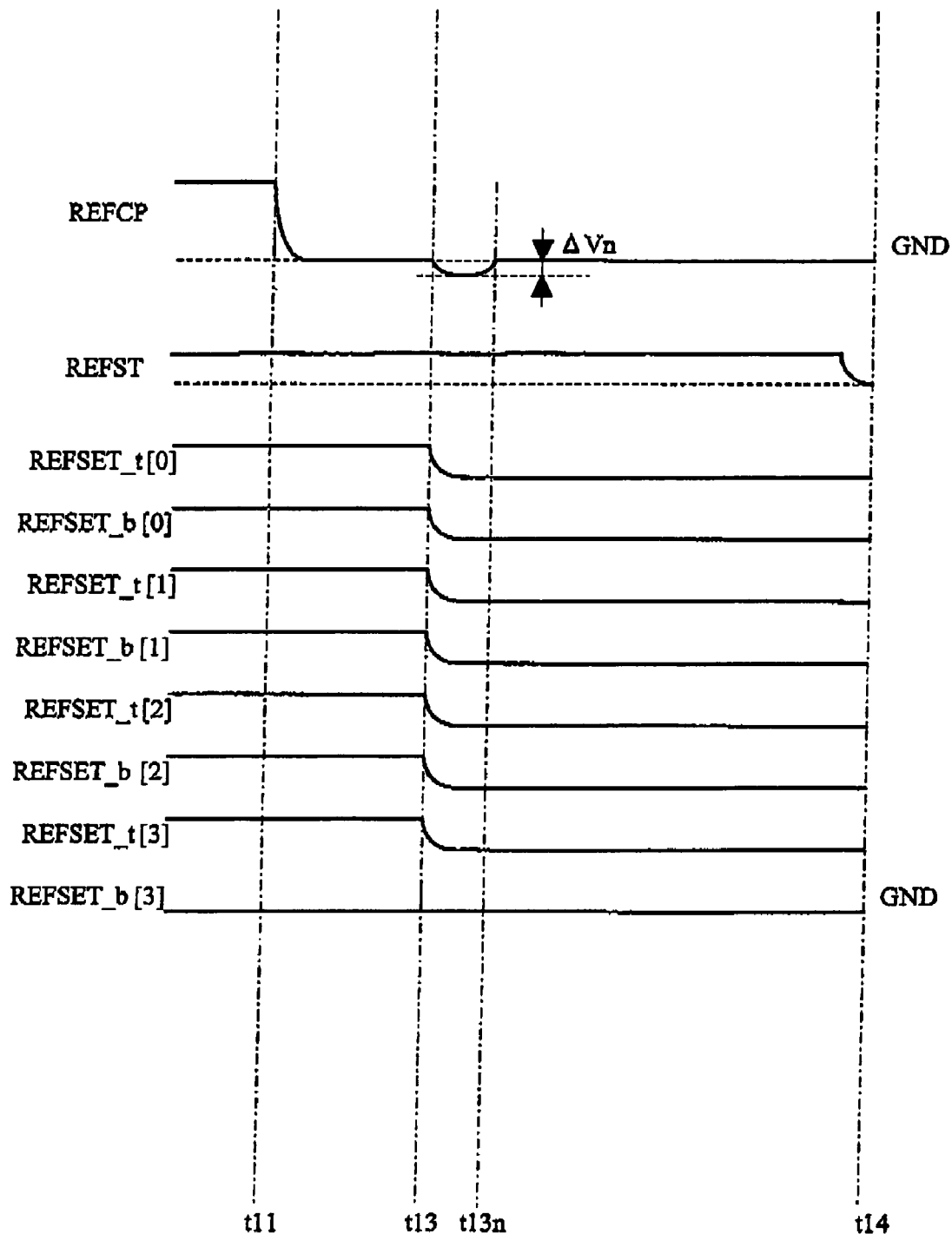
FIG. 6 is a time chart when a different data is written to each cell plate according to an embodiment of the present invention.

FIG. 6 shows the relationship between REFCP and REFSET_t [3:0] and REFSET_b [3:0] when different data is mixed (in this example, one data "0" and seven data "1" are written to the reference cells at n=3 in FIG. 1).

In the timing chart in FIG. 6, the data "1" is written for ΔVn in FE_b [3], where the data "0" is supposed to be written in the period of the timing t13 to t13a (called cell plate noise). Therefore the reference potential deviates from a desired potential. In FIG. 5, all the data is the same, and reversed writing does not occur, so a desired reference potential can be acquired.

Figure 7:
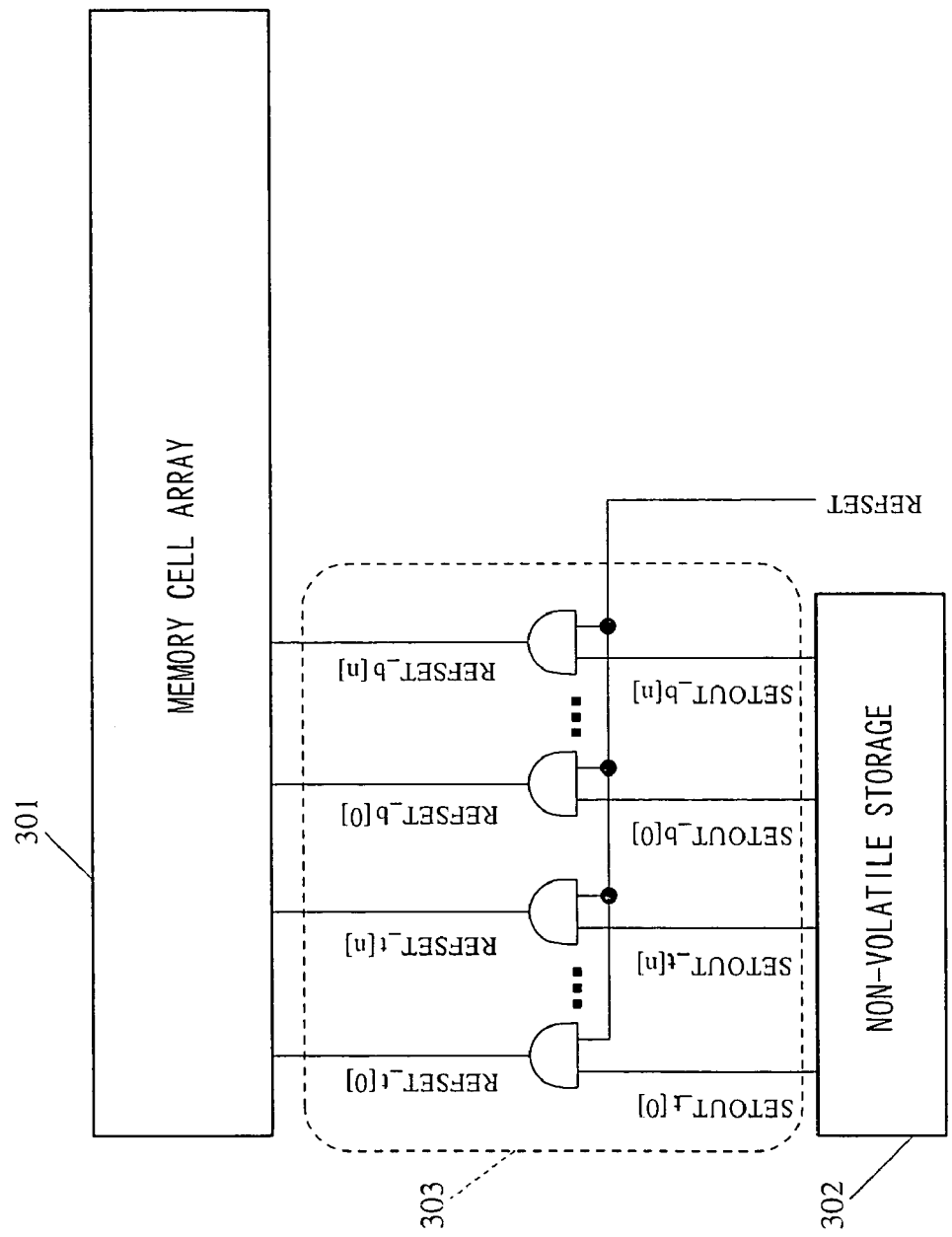
FIG. 7 is a diagram depicting an example of a circuit for setting a potential of a reference cell write control line according to this embodiment.

FIG. 7 shows an example of a circuit configuration for selectively setting the potential of the reference cell write control line.

301 is a memory cell array that includes reference cells, 1T1C type FeRAM memory cells and sense amplifiers, and is the one shown in FIG. 1.

302 is a non-volatile storage, and has 2n bit of storage capacitance. 303 is a reset control circuit, which is a potential setting circuit for selectively setting at least one of the potentials of the first, second, third and fourth reference cell write control lines REFSET_t [0], REFSET_b [0], REFSET_t [1] and REFSET_b [1] to the first potential or the second potential independently from at least one of the other reference cell write control lines. SETOUT_t [n:0] and SETOUT_b [n:0] are the output data of the non-volatile storage 302, and REFSET is a signal for controlling REFSET_t [n:0] and REFSET_b [n:0]. By storing a desired data in the non-volatile storage 302, the REFSET_t [n:0] and REFSET_b [n:0] can be controlled as desired, so the reference level can be adjusted.

The non-volatile storage means 302 can be implemented not only by the semiconductor storage elements, but also by laser fuses.

Figure 8:
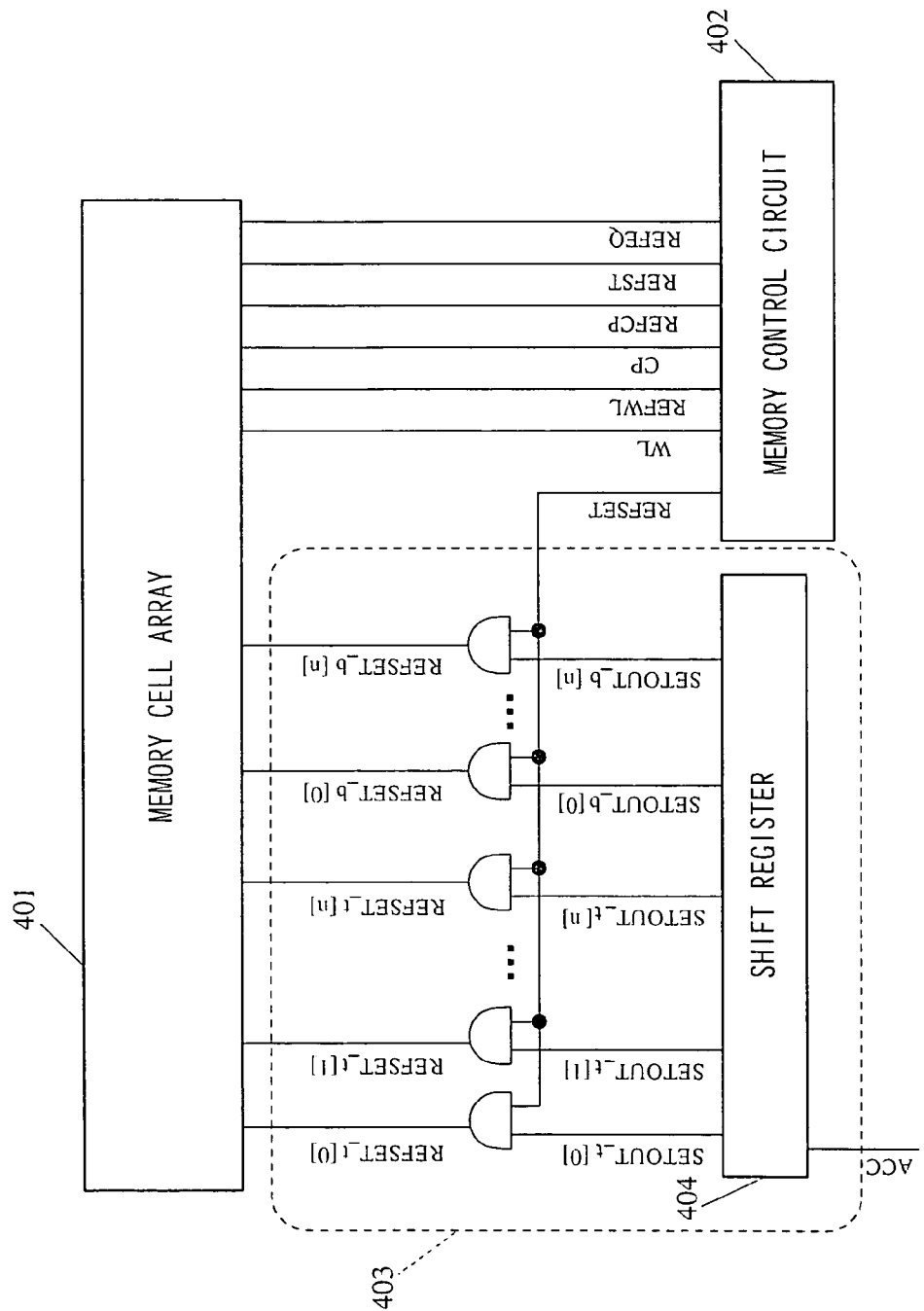
FIG. 8 is a diagram depicting another example of a circuit for setting a potential of a reference cell write control line according to this embodiment.

FIG. 8 shows another example of a circuit configuration for selectively setting the potential of the reference cell write control line.

401 is a memory cell array including the reference cells, 1T1C type FeRAM memory cells and sense amplifiers, and is the one shown in FIG. 1.

402 is a memory control circuit, 403 is a reset control circuit, and 404 is a 2n bit shift register. ACC is a read access recognition signal of the memory cells, and this signal becomes VDD when accessed, and becomes ground level when access ends.

The shift register shifts using this ACC as a clock. If the shift register is initialized with a desired data, a desired control can be performed for REFSET_t [n:0] and REFSET_b [n:0], and the reference potential can be adjusted.

Also for each read access, the data of SETOUT_t [n:0] and SETOUT_b [n:0] shifts, so the write data of the reference cells is always changed with 2n times of accesses without changing the reference potential, therefore imprint can be controlled.

In the above embodiment, in order to control the imprint of the reference cells, the control of selectively connecting the first terminals of the first and second ferroelectric capacitors to the first potential or the second potential selectively is changed for each cycle, but this can be optimized by controlling the reference potential depending on the operation environment, such as temperature, for each read cycle, with the detection circuit mounted, such as a temperature detection circuit, when the reference potential depends on the operation environment, such as temperature.

Figure 9:
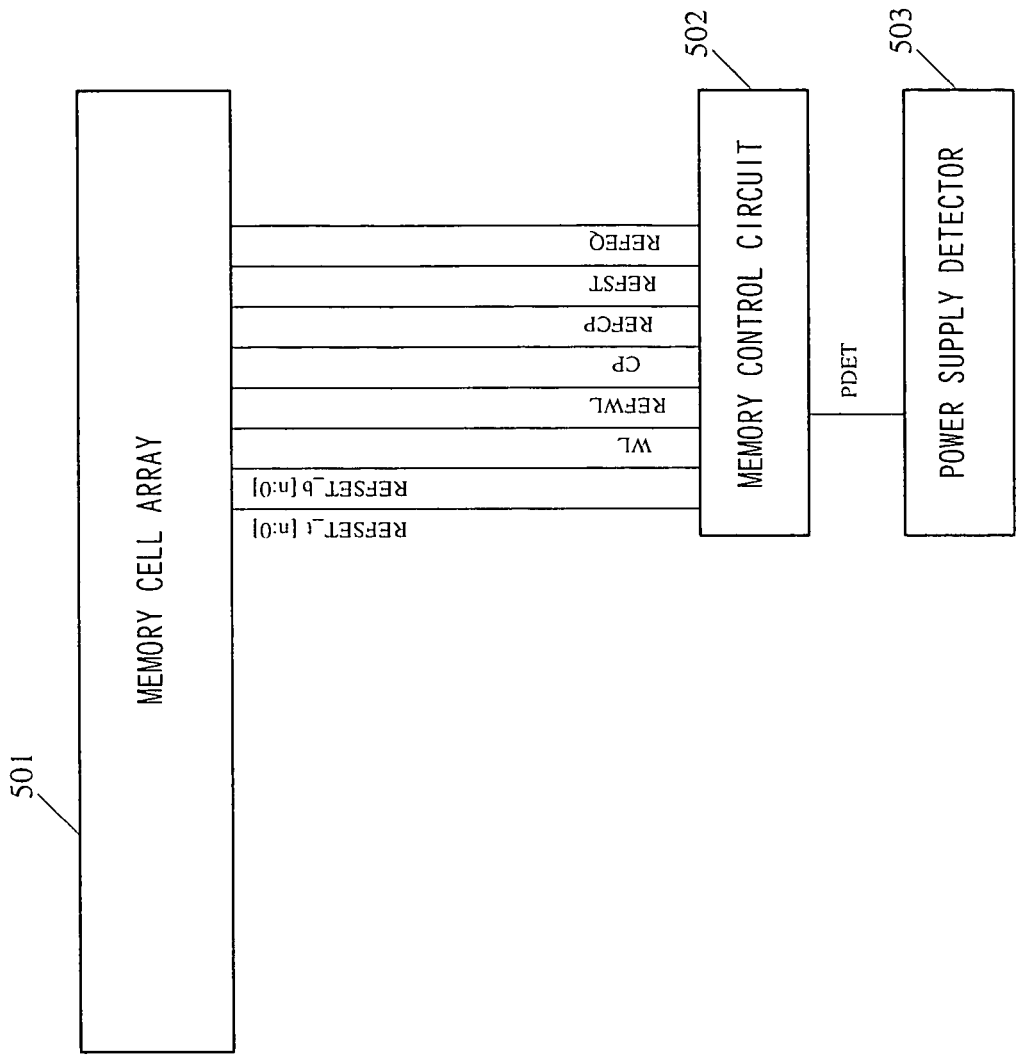
FIG. 9 is a diagram depicting a configuration of a semiconductor memory device according to an embodiment of the present invention when the power supply voltage is detected and the reference cell is written.

FIG. 9 shows a circuit configuration according to an embodiment of the present invention, where the power supply voltage is detected and the reference cells are written.

501 is a memory cell array including reference cells, 1T1C type FeRAM memory cells and sense amplifiers, and is the one shown in FIG. 1.

502 is a memory control circuit, and 503 is a power supply detector. PDET is a power supply detection signal, which becomes ground level when the power supply voltage is at a predetermined value or less, and becomes VDD level at the predetermined level or more.

Figure 10:
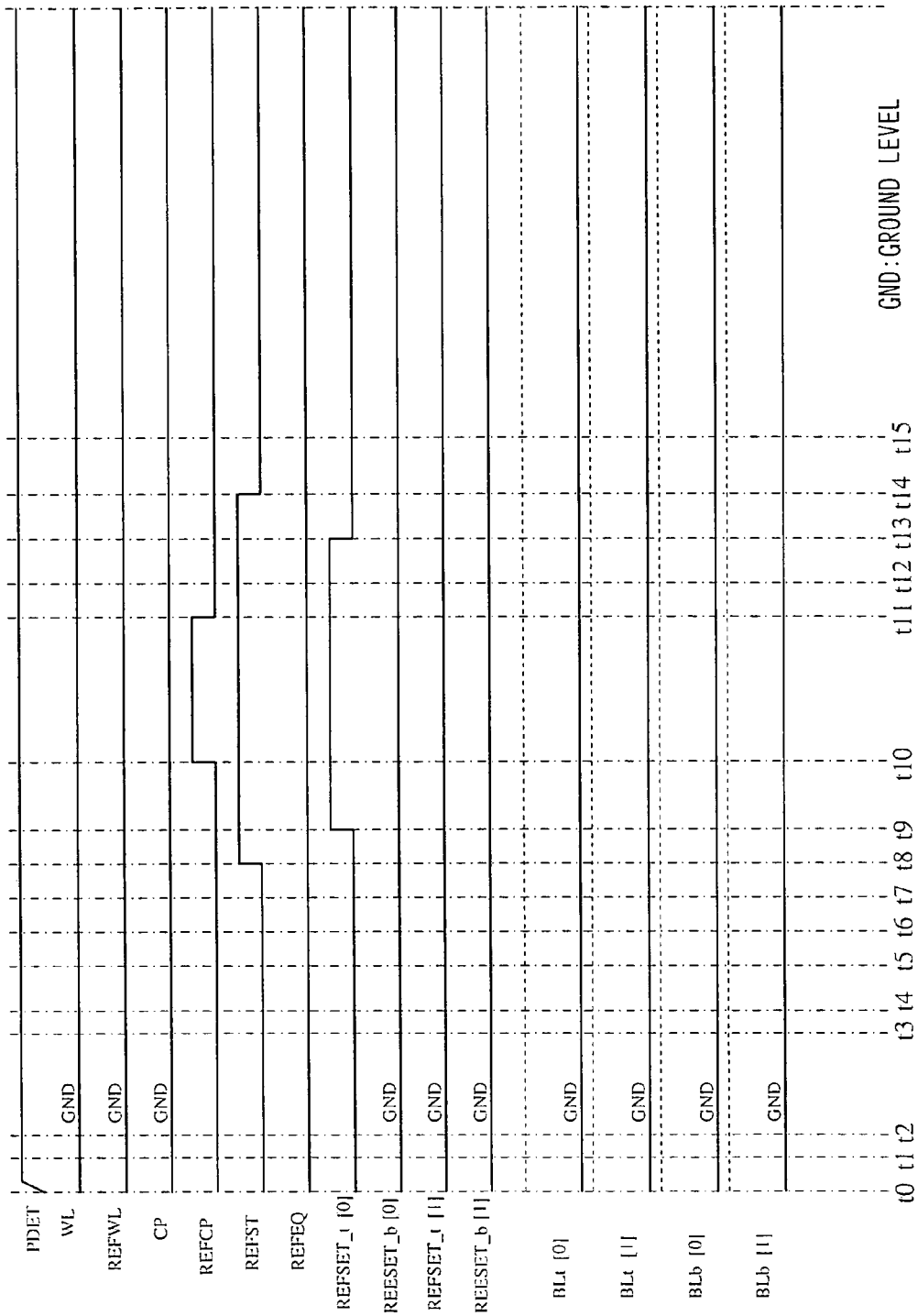
FIG. 10 is a timing chart of FIG. 9.
Figure 11:
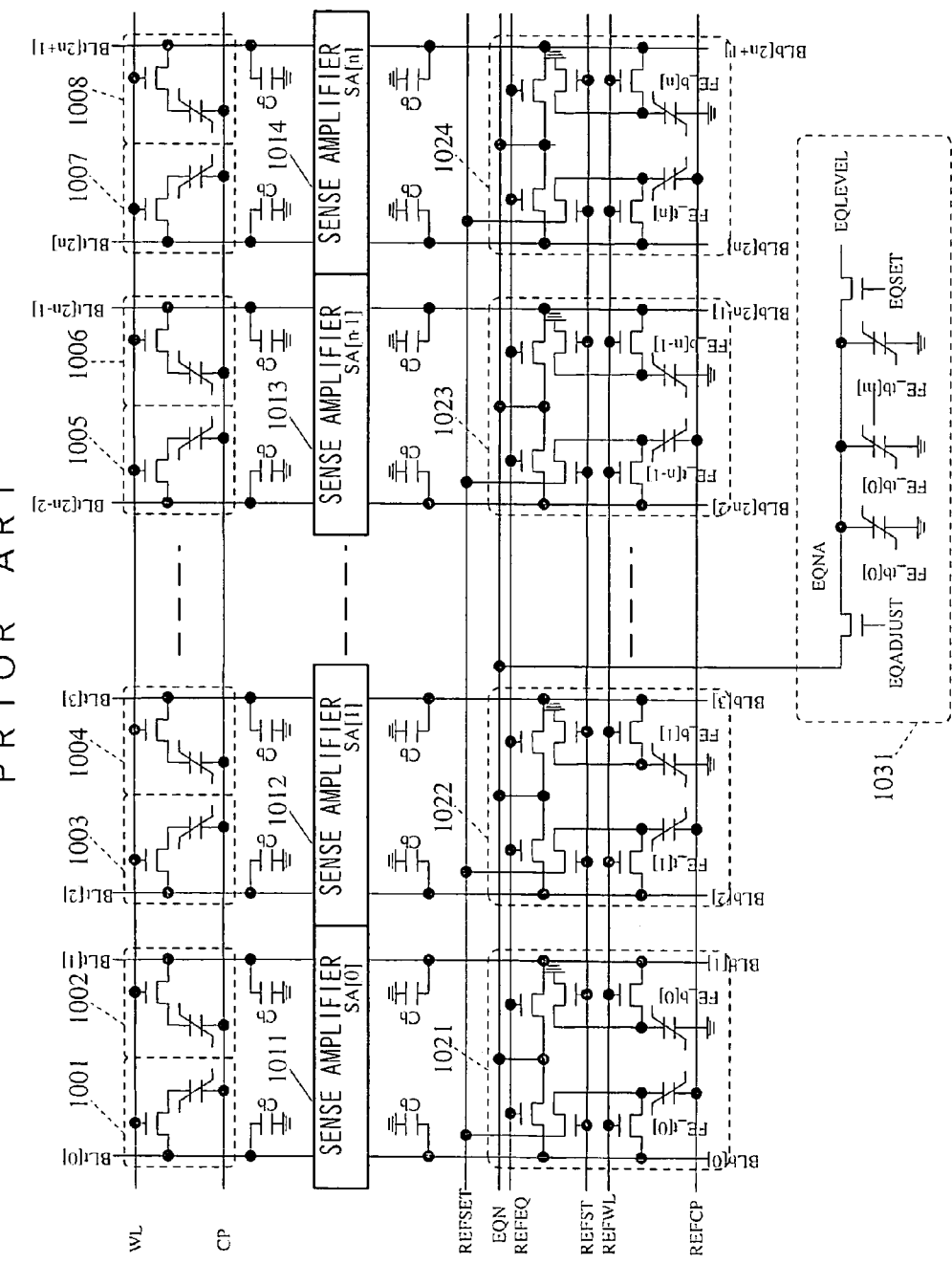
FIG. 11 is a diagram depicting a configuration of a semiconductor memory device of a prior art.
Figure 12:
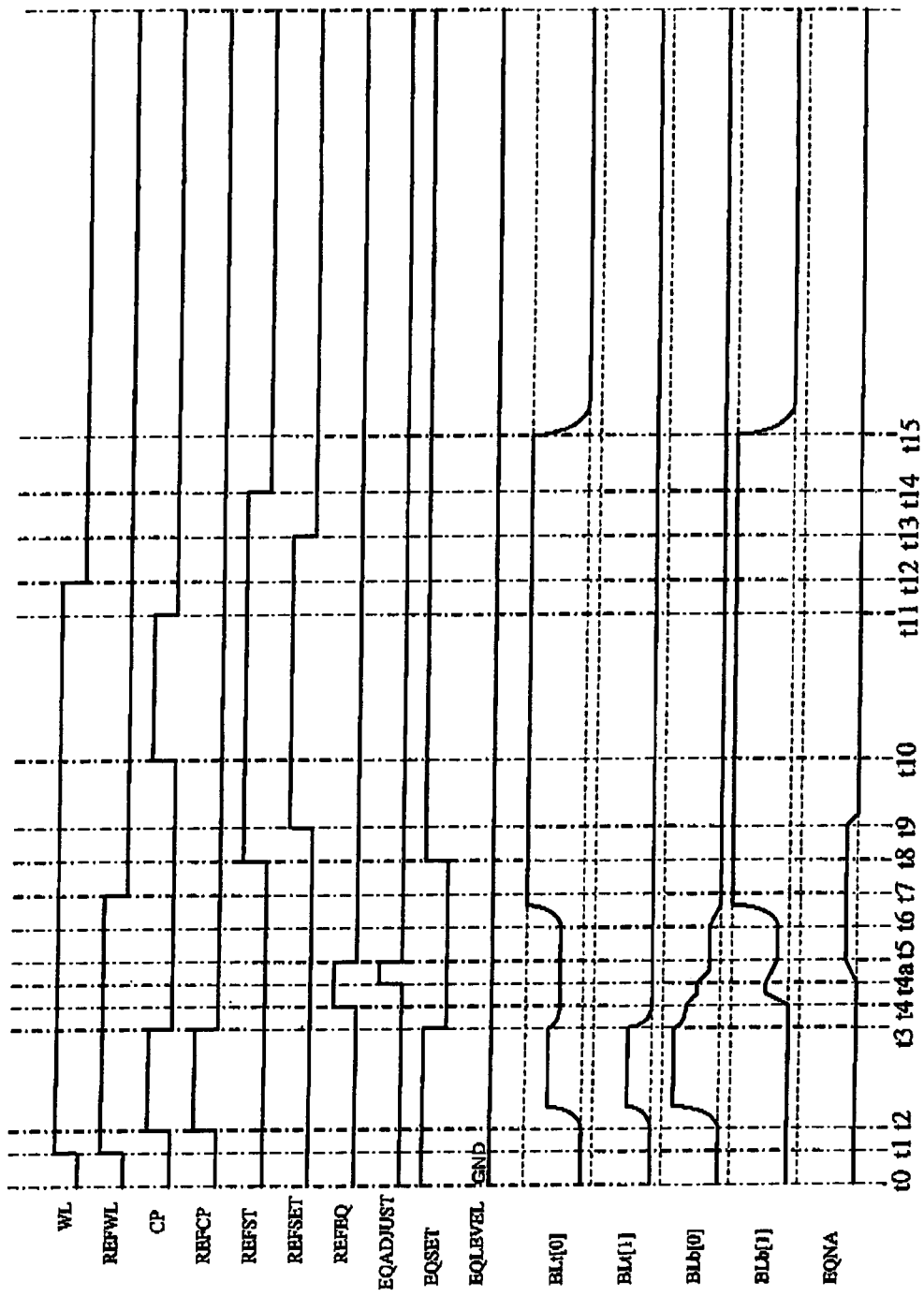
FIG. 12 is a timing chart of this prior art.

FIG. 10 shows a timing chart.

At the timing t0, PDET becomes VDD because the power supply voltage became the predetermined value or more. At the timing t8, REFST becomes VPP level, and at the timing t9, the data "1" is written to FE_t [n:0] and FE_b [n:0] of the reference cells (a reference cell "1" write), which set REFSET_t [n:0] and REFSET_B [n:0] to VDD level. In FIG. 10, only REFSET_t [0] becomes VDD level, so "1" is written to FE_t [0].

At the timing t10, REFCP becomes VDD level, and the data "0" of the 1T1C type ferroelectric memory cells is rewritten, and the data "0" is written to FE_t [n:0] and FE_b [n:0] of the reference cells which set REFSET_t [n:0] and REFSET_b [n:0] to ground level (a reference cell "0" write). In this embodiment, REFSET_t [1] and REFSET_b [1:0] are ground level, so "0" is written to FE_t [1] and FE_b [1:0].

At the timing t11, REFCP becomes ground level, and the rewriting of the data "0" ends.

At the timing t13, REFSET becomes ground level, and the writing of the data "0" to the ferroelectric capacitors FE_t [n:0] of the reference cells ends, REFST becomes ground level, the first terminals of the reference cells FE_t [n:0] and FE_b [n:0] are disconnected from REFSET_t [n:0] and REFSET_t [n:0] respectively, and the write operation of the reference cells completes.

In the above embodiments, the reference potential can be stabilized by automatically writing only the reference cells after power is applied, where only the reference cell operation can be arbitrarily executed. If fine adjustment of the reference potential is necessary according to the change of the operation environment (e.g. temperature, voltage change), needless to say the write data of the reference cells can be set again using the technique of the circuit configuration for selectively setting the potential of the reference cell write control lines shown in FIG. 8, which allows fine adjustment of the reference level according to the operation environment to be possible.

The above embodiments described details on the reference potential generation system using ferroelectric capacitors, but the present invention can also be applied to a reference potential generation system using paraelectric material. Also the configuration of the open bit line type memory cell array was described, but the present invention can also be applied to a folded type bit line configuration.

As described above, according to the present invention, fine adjustment of the reference potential is possible in the ferroelectric memory without mask correction, by which the read operation margin can be improved, and yield can be improved.

Also by comprising the non-volatile storage, fine adjustment of the reference potential after inspection or after the assembly step becomes possible.

Also by using a configuration which allows the write operation of only the reference cells, the reference potential can be stabilized (e.g. retention characteristics improvement).

What is claimed is:

1. A semiconductor memory device, comprising:
   a first, second, third and fourth bit lines to be connected to a first, second, third and fourth ferroelectric memory cells respectively;
   a fifth, sixth, seventh and eighth bit lines to be connected to sense amplifier circuits forming a pair with said first, second, third and fourth bit lines respectively;
   a first, second, third and fourth reference cell capacitors to be connected to said fifth, sixth, seventh and eighth bit lines respectively when a reference word line is activated;
   a first, second, third and fourth reference cell write control lines to be connected to said first, second, third and fourth reference cell capacitors when a reference cell write control line select signal (REFST) is activated;
   equalization circuits for equalizing the potential of said fifth, sixth, seventh and eighth bit lines when an equalization control signal (REFEQ) is activated; and
   a potential setting circuit for selectively setting at least one potential of said first, second, third and fourth reference cell write control lines to a first potential or a second potential independently from at least one of the other reference cell write control lines.

2. The semiconductor memory device according to claim 1, wherein the potential setting of said first, second, third and fourth reference cell write control lines by said potential setting circuit is executed using stored data in a non-volatile storage.

3. The semiconductor memory device according to claim 1, wherein said first, second, third and fourth reference cell capacitors are ferroelectric capacitors.

4. The semiconductor memory device according to claim 1, wherein the potential setting of said first, second, third and fourth reference cell write control lines by said potential setting circuit is changed depending on stored data in a register for each read cycle.

5. The semiconductor memory device according to claim 1, wherein a first terminal of said first reference cell capacitor, a first terminal of said second reference cell capacitor, a first terminal of said third reference cell capacitor and a first terminal of said fourth reference cell capacitor are connected to said fifth, sixth, seventh and eighth bit lines respectively by the activation of said reference word line, wherein said first terminal of said first reference cell capacitor, said first terminal of said second reference cell capacitor, said first terminal of said third reference cell capacitor, and said first terminal of said fourth reference cell capacitor are connected to said first, second, third and fourth reference cell write control lines respectively by the activation of said write control signal.

6. The semiconductor memory device according to claim 5, wherein said first, second, third and fourth reference cell capacitors are ferroelectric capacitors.

7. The semiconductor memory device according to claim 6, wherein said first terminal of said first reference cell capacitor, said first terminal of said second reference cell capacitor, said first terminal of said third reference cell capacitor, and said first terminal of said fourth reference cell capacitor are connected to said first, second, third and fourth reference cell write control lines respectively, wherein a second terminal of said first reference cell capacitor, a second terminal of said second reference cell capacitor, a second terminal of said third reference cell capacitor and a second terminal of said fourth reference cell capacitor are controlled so that the data can be written to said first, second, third and fourth reference cell capacitors, when a memory cell array, including said first, second, third and fourth ferroelectric memory cells, is not selected.

8. The semiconductor memory device according to claim 7, further comprising a power supply detection circuit, wherein the reference cell rewrite operation for rewriting the data to said first, second, third and fourth reference cell capacitors after power is applied is automatically executed.

* * * * *